United States Patent [19]

Papuchon et al.

[11] Patent Number: 4,560,867
[45] Date of Patent: Dec. 24, 1985

[54] INTERFEROMETER DEVICE FOR MEASUREMENT OF MAGNETIC FIELDS AND ELECTRIC CURRENT PICKUP COMPRISING A DEVICE OF THIS KIND

[75] Inventors: Michel Papuchon; Hervé Arditty; Claude Puech, all of Paris, France

[73] Assignee: Thomson-CSF, Paris, France

[21] Appl. No.: 734,246

[22] Filed: May 14, 1985

Related U.S. Application Data

[63] Continuation of Ser. No. 424,761, Sep. 27, 1982, abandoned.

[30] Foreign Application Priority Data

Nov. 3, 1981 [FR] France ............................ 81 20594

[51] Int. Cl.⁴ .............................................. G02F 1/01
[52] U.S. Cl. .................................... 250/225; 250/227; 324/96; 356/368
[58] Field of Search ............... 356/351, 365, 368; 324/96, 244; 455/610; 250/225, 227, 231 R; 350/96.15; 332/7.51

[56] References Cited

U.S. PATENT DOCUMENTS

| | | | |
|---|---|---|---|
| 2,341,422 | 2/1944 | Bubb | 356/351 |
| 3,581,202 | 5/1971 | Pelenc et al. | 324/96 |
| 4,356,448 | 10/1982 | Brogardh et al. | 324/244 |
| 4,363,061 | 12/1982 | Vaerewyck et al. | 324/96 |
| 4,412,720 | 11/1983 | Costa | 350/96.15 |
| 4,443,698 | 4/1984 | Schiffner | 250/227 |

OTHER PUBLICATIONS

Scheider et al., "Low-Birefringence Single-Mode Optical Fibers", Oct. 1978, Applied Optics, pp. 3035-3037.

Primary Examiner—David C. Nelms
Assistant Examiner—J. Gatto
Attorney, Agent, or Firm—Oblon, Fisher, Spivak, McClelland & Maier

[57] ABSTRACT

The invention relates to a device for measuring a magnetic field, comprising a source of rectilinearly polarized light. A magnetooptical medium is situated in the path of the beam, this medium being followed by a mirror refecting this beam. This medium is a medium of which the intrinsic propagation modes are polarized in right-hand and left-hand directions, and which retains the circular polarization. An element acting as a separator by polarization is situated between the source and the medium, a detector device being coupled to the same.

11 Claims, 3 Drawing Figures

INTERFEROMETER DEVICE FOR MEASUREMENT OF MAGNETIC FIELDS AND ELECTRIC CURRENT PICKUP COMPRISING A DEVICE OF THIS KIND

This application is a continuation of application Ser. No. 424,761, filed Sept. 27, 1982 now abandoned.

BACKGROUND OF THE INVENTION

The invention relates to a magnetic field detector unaffected by external parameters such as temperature and pressure, for example.

In a ring interferometer, two beams traverse an identical optical path in opposed directions and interfere upon emerging from this path. Provided that a disturbance of this path has identical characteristics for both directions of propagation and does not vary during the transit period of the light in the interferometer, the two beams are affected identically and their relative phase remains unchanged. The disturbances of this kind are referred to as "reciprocal". Because the transit period in an interferometer is commonly very short, the variations of a disturbance are commonly negligible during this period, unless the same is introduced intentionally.

However, there are "non-reciprocal" disturbances which have a different amplitude in the two directions of propagation, these consisting of physical actions, which, by establishing its overall orientation, destroy the symmetry of the space or environment.

Two known effects have this property:

the Sagnac effect, or relativistic inertial effect, in which the rotation of the interferometer with respect to a Galilean datum destroys the symmetry of the propagation periods;

the Faraday effect or colinear magnetooptical effect, in which a magnetic field generates a preferential orientation of the spin of the electrons of the optical material.

A prior art device described in the European patent application made by the applicants and published on Jan. 28, 1981 under the number 0 023 180, relates to a current measuring device comprising an optical fibre wound around a conductor in which flows the current I which is to be measured, this optical fibre comprising one or more turns, the two extremities of this optical fibre each receiving an optical radiation coming from a laser, for example; these two waves flows in the fibre in opposed directions. The current flowing in the conductor induces a magnetic field in the same direction as the direction of propagation of one of the waves and in the opposed direction to that of the other. The two waves emerging from the fibre have a phase displacement $\Delta\Phi$ which depends on the Verdet constant characteristic of the Faraday effect of the propagation medium, on the intensity I of the current flowing in the conductor, possibly on the number N of conductors if the optical fibre surrounds several conductor branches wherein flows the same current I, and on the number M of turns of the optical fibre encircling the conductor. (The Verdet constant, a constant of proportionality in the equation of the Faraday effect, is equal to the angle of rotation of plane-polarized light in a magnetized substance divided by the product of the length of the light path in the substance and the strength of the magnetic field.)

To demonstrate the phase displacement between the two waves, this measuring device utilises an interferometer structure of the "Sagnac" type, the two counterrotating waves emerging from the extremities of the fibre being recombined and the corresponding signal being detected by a photodetector. These two waves thus undergo, in the same manner, the reciprocal effects which within the medium induce variations varying in the same direction in the conditions of propagation, and by non-reciprocal Faraday effect undergo variations in the opposed direction. These variations in opposed direction are liable to be detected by an interferometer method.

Compared to this prior art device, the device of the invention offers different advantages, such as its considerable simplicity and small number of components. Furthermore, no alignment of any kind is needed, unless it is that of the source and of the fibre, which forms part of the prior art. Moreover, this device has considerable geometrical flexibility in particular regarding the waveguide length and the geometrical arrangement imparted to this wave guide.

Only "non-reciprocal" disturbances have an effect on the signal detected, in the device of the invention. The dimensional variations, such as flowage, thermal expansion, pressure variation or refraction index variations, for their part have no effect on the signal detected. An instrument for measuring "non-reciprocal" effects, which offers perfect stability, is thus available in principle.

In practice, so that the reciprocal disturbances have absolutely no effect, the two beams of the interferometer should travel along precisely the same trajectory. More specifically, the two waves should be two identical solutions of the wave equation of the interferometer, the sign of the "time" parameter being reversed.

This condition is never rigorously fulfilled if the interferometer is constructed for free propagation, which is the case of the application of discrete optical elements:

the wave equation provides a "continuum" of solutions and at least misalignment of the optical system leads to obtaining different solutions, that is wave fronts which are not superposed, even for solutions which are identical when considering waves of infinite extension, plane waves for example, the distribution of intensity which is perforce limited in practice, actually differs if only because of the diffraction, and disrupts the reciprocity.

A solution of the single-mode type consequently consists in a device produced as a wave guide structure from end to end.

SUMMARY OF THE INVENTION

The invention provides an interferometer device for measuring a magnetic field, comprising a source providing a rectilinearly polarised light beam, a propagation medium positioned on the trajectory of the beam, an element performing separation by polarisation placed between said source and said medium, a detection device coupled to this element performing separation by polarisation, the propagation medium being a magnetooptical medium, a mirror being situated at right angles to the direction of propagation of this beam after traversal of this medium.

The invention equally relates to an electric current pickup comprising a device of this kind.

BRIEF DESCRIPTION OF THE DRAWINGS

A better understanding of the invention will be obtained and other features will appear from the following description, taken in conjunction with the accompanying drawings, in which.

DESCRIPTION OF THE PREFERRED EMBODIMENT

Figure 1:
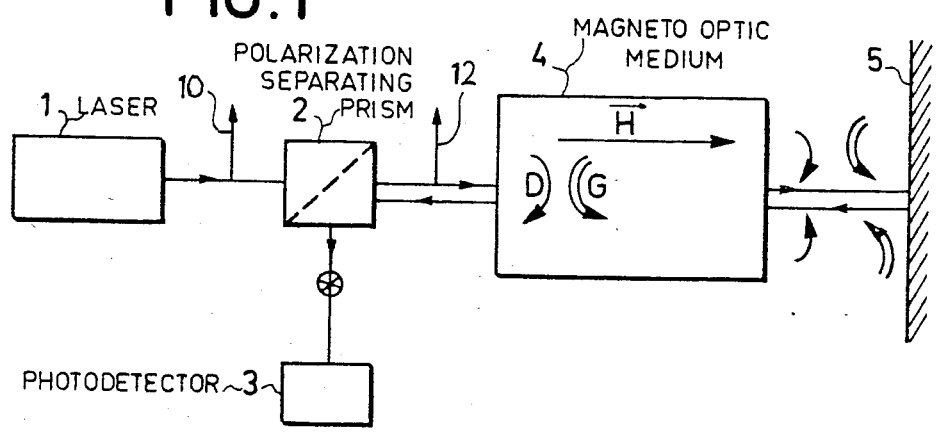
FIG. 1 is a diagram illustrating one embodiment of a device according to the invention.

In the same manner as in the case of free propagation in a material medium, the magnetic field component colinear with the direction of propagation of the light in an optical fibre induces a non-reciprocal optical activity proportional to the intensity of the magnetic field and to the Verdet constant of the material.

This non-reciprocal optical activity has its origin in the action of the magnetic field on the orientation of the spin of the electrons. This action is manifested by a decomposition of the spectrum lines into several components symmetrical with respect to the original line (Zeeman effect). If the observation is taken in the direction of the magnetic field, two circularly polarised components are observed of which the spacing is proportional to the intensity of the magnetic field, the greater wavelength line commonly having a circular polarisation of opposite direction to that of the current generating the magnetic field. The initial dispersion curve is thus replaced by two staggered curves the one corresponding to the right-hand circular vibrations and the other to the left-hand circular vibrations. At the operating wavelengths, commonly much higher than the absorption band wavelength, a dual circular birefringence consequently appears which is proportional to the intensity of the magnetic field and linked to its orientation and to that of light propagation, and thus non-reciprocal. This Faraday effect depends on the material in question (Verdet constant). If it is very low for diamagnetic materials, it increases successively for the paramagnetic and then the ferromagnetic materials. It is of importance to note that the Verdet constant is unaffected by temperature for diamagnetic materials only. Since silica, forming the low-attenuation optical fibres, forms part of this category, an ammeter pickup produced from such fibres has the benefit of this property of interest to the user.

In the case of free propagation in a passive medium and in the case of guided propagation within an ideal single-mode optical fibre, that is in which the two polarisation modes polarised quasi-linearly, of identical intensity distribution and orthogonal polarisations (mode $HE_{11}$) have degenerated totally, in the absence of a magnetic field, the right-hand and left-hand polarisations encounter the same refractive index. This is no longer the case in the presence of a magnetic field, in which the right-hand and left-hand polarisations encounter a different index. The result is that an incident linear polarisation is rotated through an angle $\Delta\Phi$ proportional to the magnetic field H.

It is of importance to distinguish the properties of the dual circular magnetic refractivity (Faraday effect) from those of the natural dual circular refractivity (natural rotatory capacity or optical acticity). The Faraday effect depends on the direction of propagation of the light and is not reciprocal, whereas the natural rotatory capacity is independent of the direction of propagation of the light and is reciprocal (a material is dextrorotatory or leveorotatory independently of the direction of propagation of the light). It follows that if the light is returned through the material again after reflection on a mirror, the rotation is doubled in the first case whereas it is cancelled in the second.

The optical fibre is affected by variations of the environment which may in particular induce a reciprocal optical activity (principally due to the elasto-optical interactions in torsional phenomena) liable to change in time and which could naturally be perceived as a circular magnetic dual refractivity in a mensuration method based on the determination of the angle $\Delta\Phi$ after a single traversal of the optical fibre.

In order to eliminate this drawback, it is of importance to utilise a configuration of the experimental device which is unaffected by the reciprocal interference actions. The configuration of the invention is particularly appropriate.

The embodiment of the invention as illustrated in FIG. 1, exploits the utilisation of the magnetic effect within a guiding medium 4, such as a single-mode optical fibre, for example.

This effect corresponds to a non-reciprocal phase displacement between two circularly polarised waves (one right-handed and the other left-handed) under the action of the magnetic field component parallel to the direction of propagation. This phase shift may be expressed in the form:

$$\Delta\Phi = AVHL$$

in which V is the Verdet constant of the material, H the magnetic field applied parallel to the axis of the fibre and L the length of interaction. A is a constant depending in particular on the wavelength utilised.

In order to demonstrate the phase displacement between the two waves, the measuring instrument of the invention employs an interferometer structure, the two waves emerging from the medium 4 being recombined and the corresponding signal being detected by a photodetector 3.

This interferometer structure is a structure of the "Sagnac" type in which the measuring loop has been flattened.

If a light wave is propagated in the medium 4, the magnetic field causes variations in the light wave propagation conditions by magnetooptical effect. When the magnetic field and the direction of propagation of the light wave are parallel, the magnetooptical effect induced on the light wave is a non-reciprocal effect, a Faraday effect, depending on the direction of propagation of the wave as compared to the direction of the magnetic field.

So that this non-reciprocal effect may elicit a measurable quantity directly linked to the magnetic field, and which consequently does not incorporate other effects and in particular reciprocal effects which for their part cause variations in the conditions of propagation (temperature variation or pressure variation, for example), the device of the invention makes use of two waves.

These two waves are exposed in the same manner to the reciprocal effects which within the medium induce variations in the conditions of propagation varying in the same direction, and undergo variations in opposed directions by non-reciprocal Faraday effect. These contradirectional variations are able to be detected by an interferometer method.

Figure 2:
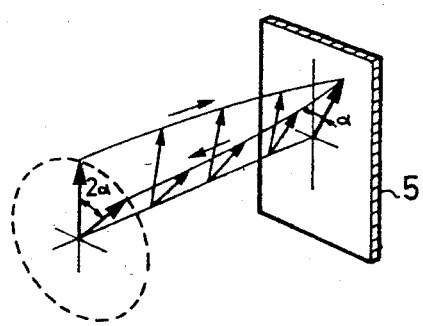
FIGS. 2 and 3 illustrate two particular features of the device according to the invention.

In effect, the linearly polarised light 10 emerging from the laser 1, after traversing the polarising separator prism 2, as indicated by reference numeral designation 12, reaches the magnetooptical medium 4 whose intrinsic polarisation modes are polarised in right-handed and left-handed manner. These two circularly polarised right-hand and left-hand waves reach the mirror 5. The waves having right-handed circular polarisation, after reflection from this mirror acquires left-hand circular polarisation, and in exchange, the wave having circular left-hand polarisation acquires circular right-hand polarisation as shown in FIG. 2.

Thus, this mirror 5 causes a change of direction and a reversal of the circular polarisation of the waves reaching it.

This medium 4 is produced from any medium displaying a Faraday effect, this effect being the more powerful the more magnetic the material. This effect is more substantial with a ferromagnetic material than with a diamagnetic material, but in this latter case, the effect does not depend on temperature.

The light waves of left-hand and right-hand circular polarisations are propagated in the medium 4 and undergo a phase displacement induced by Faraday effect by the magnetic field. The magnetooptical medium induces variations of polarisation in the light waves propagated. These effects are reciprocal and act on both waves in the same manner; by contrast, the magnetic rotatory polarisation effect acting only on the circular polarisation waves to cause a lead or lag to each of the components, acts in different directions on the two waves and thus causes an overall phase displacement $\Delta\Phi$ between them. As a matter of fact, for these waves, establishing the magnetic field parallel to the direction of propagation advances the circular vibration in the same direction as the magnetising current and delays the contradirectional circular vibration by an equal quantity. Even if the state of the polarisation of the light wave varies during its propagation along the fibre, the advance and delay effects are accumulated along this fibre and the two emergent waves display a phase displacement able to be detected by interferometry with direct representation of the effects induced by the magnetic field, the other effects being undergone in identical manner by the two waves and consequently without inducing a phase displacement between them.

Figure 3:
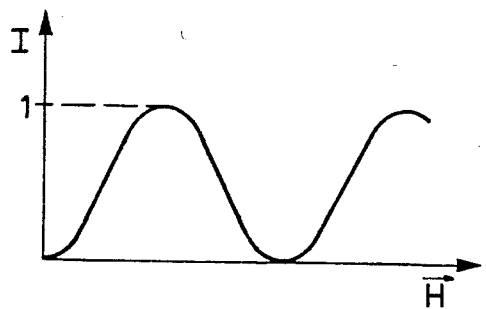

The measuring device illustrated provides a liminous intensity I at the detector which varies as a function of the phase displacement $\Delta\Phi$ between the two waves and thus of the magnetic field, as shown in the graph in FIG. 3.

Consider the fundamental layout of FIG. 1. The linearly polarised light emerging from a laser 1 first passes through a polarising separator prism 2. It then passes through the magnetooptical medium 4 of which the intrinsic propagation modes are assumed to have right-hand and left-hand polarisation. After traversal of this medium 4, these waves are reflected on a mirror 5 and pass into the medium 4 again for analysis by 2. Detection is assured by means of a photodetector 3.

The waves traversing the medium 4 from left to right have the output phases:

$\Phi_D \alpha n_D L$ (wave of right-handed polarisation)
$\Phi_G \alpha n_G L$ (wave of left-handed polarisation)

If a magnetic field H is applied, phase displacements $\Delta\Phi_H$ and $-\Delta\Phi_H$ are induced:

$\Phi_D \alpha n_D L + \Delta\Phi_H$
$\Phi_G \alpha n_G L - \Delta\Phi_H$

As shown in FIG. 2, the right-handed wave changes to left-handed upon reflection by the mirror 5. Similarly, the left-handed wave changes to right-handed.

The relative direction of the field and the direction of propagation having been reversed, these waves reemerge from the medium 4 with the phases:

$\Phi_{DG} \alpha n_D L + n_G L + \Delta\Phi_H + \Delta\Phi_H$
$\Phi_{GD} \alpha n_G L + n_D L - \Delta\Phi_H - \Delta\Phi_H$ from whence $$\Delta\Phi = \Phi_{DG} - \Phi_{GD} = 4\Delta\Phi_H$$

and the phase displacements caused by the natural dual refractivity of the medium and to reciprocal variations have disappeared.

This phase displacement $\Delta\Phi$ causes the appearance of a light signal on the photodetector 3 manifesting the action of the magnetic field H.

The sensor is thus sensitive to the magnetic field and insensitive to the reciprocal parameters of the medium.

The element 2 may be a polarising separator cube formed by two bonded prisms, the separation surface formed by the hypotenuse of these two prisms being treated in such manner as to be a polarisation separator. This element has a preferential optical axis. The incident rays having a direction of polarisation parallel to this axis are transmitted totally, without modification, parallel to the direction of incidence. The incident rays having a polarising direction orthogonal to the preceding direction are wholly reflected along a direction orthogonal to the direction of incidence. A surface treatment is moreover performed on the faces of the cube to avoid disturbing reflections.

This element 2 could also be an integrated optical circuit fed by the source 1 coupled directly by its face to the integrated circuit board in the same manner as the medium 4 and the detector 3.

After reflection on the mirror, the two circularly polarised waves follows the reverse optical path and are still circularly polarised.

However, the composite beam transmitted to the polariser cube is repolarised linearly. As explained, the phase displacements caused by the natural dual refracticity of the medium and by reciprocal variations have disappeared upon emergence from the medium along the return path of the two waves.

The rotatory capacity will be balanced in the two directions in the medium 4, contrary to the Faraday effect which will accumulate.

Thus, without an electric field and consequently without Faraday effect, an identical linear polarisation to that along the outgoing path is obtained upon return to the polarising separator, and the resultant wave is consequently directed towards the source.

By contrast, if there is a magnetic field colinear with the direction of the light wave, the projection of the resultant linear wave on the $\pi/2$ polarisation is no longer nil, and a part of the light wave depending on the magnetic field will reach the detector, and as a matter of fact upon traversing the polarisation separator cube, it will be reflected by the common surface of the cube.

To produce the medium 4, it is possible to consider an optical fibre having little or no linear birefringence. This fibre may be formed from a material having a more pronounced Faraday effect, such as iron and Yttrium garnet (Yig). It may also be produced from silica, for which the Faraday effect is weak but unaffected by temperature.

The single-mode fibres normally produced for telecommunications purposes always display a small quantity of linear birefringency and of circular birefringency. Consequently, these fibres do not retain either the linear polarisation or the circular polarisation.

The fibre may be made highly birefringent linearly by disrupting the circular symmetry to the benefit of a planar symmetry.

It is equally possible to consider an inverse method, which consists in introducing a high degree of circular birefringency or rotatory capacity in such a manner as to retain the circular polarisation.

One solution for producing this circular polarisation consists in exposing the glass fibre to a static torsional stress, for example applied externally by torsion between its two extremities. One effect of this twist is to cause a circular birefringency in the same. A variety of prior art processes then render it possible to retain this torsional state. This may be in particular be by means of a mechanical collar.

The sensor may advantageously be produced by means of a single-mode fibre retaining the circular polarisation, of which the extremity had been metallised or processed in such manner as to be wholly reflective. The laser utilised may be a semiconductor laser. The optical fibre retaining the circular polarisation may be produced by twisting a single-mode fibre with a twist of the order of several tens of turns per meter. This fibre may either be left free, or wound around a conductor to form a current sensor.

It is possible to consider a fibre for which each of the elements of diffusion, impurity or discontinuity of this fibre, forms a reflective element.

If a light pulse, for example generated by a pulsed laser, is directed at the input side, it is then possible to perform a temporal analysis of these multiple reflections, which allows a longitudinal exploration of this fibre. This retrodiffusion method allows a measurement of the magnetic field along the fibre.

It is also possible to operate in reverse manner, by considering the magnetic field as being known, and studying the properties of the elements diffusing in the fibre to characterise the latter in this manner.

It is quite obvious that any conventional method for phase modulation enabling operation around a zero described for other detectors of the prior art, is applicable for the device of the invention.

The device of the invention may be employed to produce a current detector by forming a loop comprising one or more turns of this fibre around the conductor traversed by this current. As a matter of fact, for each wave, the establishing of the magnetic field parallel to the direction of propagation advances the circular vibration in the same direction as the magnetising current and delays by an equal quantity the circular vibration in the opposed direction. Even if the state of polarisation of the light wave varies during its propagation along the fibre, the advance and delay effects are cumulative along this fibre and the two emergent waves have a phase displacement able to be detected by interferometry with direct representation of the effects induced by the current I flowing in the conductor, the other effects identically affecting the two waves and consequently not causing a phase displacement between them.

We claim:

1. Interferometer device for measuring magnetic fields, comprising a source providing a beam of rectilinearly polarized light in a path along a predetermined propagation direction, a propagation medium positioned along the path of this beam, a polarization separator element situated between said source and said medium, a detector device coupled to said polarization separator element, wherein the propagation medium is a magnetooptical medium subject to a non-reciprocal phase displacement and a mirror is arranged at right angles to the direction of propagation along side an extremity of said medium opposite said separator, and wherein the magnetooptical medium has its own propagation modes polarized in right-hand and left-hand directions, said medium retaining a circular polarization.

2. Device according to claim 1, in which the source is a semiconductor laser.

3. Device according to claim 1, in which the polarisation separator element comprises two refractive prisms joined together along their hypotenuses in such manner as to form a semi-reflective separating surface.

4. Device according to claim 1, in which the polarisation separator element is an integrated optical element.

5. Device according to claim 1, in which the propagation medium is a single-mode fibre retaining the circular polarisation.

6. Device according to claim 5, in which the fibre is twisted.

7. Device according to claim 5, in which the fibre is formed from silica.

8. Device according to claim 5, in which the fibre consists of iron and Yttrium garnet.

9. Device according to claim 5, in which an extremity of the fibre is metallized.

10. Device according to claim 1, in which the source is a pulsed laser.

11. Electric current detector based on Faraday effect, comprising a device according to claim 1, the optical fibre forming at least one loop around a conductor in which a current flows.

* * * * *